United States Patent [19]

Heller et al.

[11] 4,276,368

[45] Jun. 30, 1981

[54] PHOTOINDUCED MIGRATION OF SILVER INTO CHALCOGENIDE LAYER

[75] Inventors: Adam Heller, Bridgewater; King L. Tai, Berkeley Heights; Richard G. Vadimsky, Somerville, all of N.J.

[73] Assignee: Bell Telephone Laboratories, Incorporated, Murray Hill, N.J.

[21] Appl. No.: 35,803

[22] Filed: May 4, 1979

[51] Int. Cl.³ ............................................. G03C 5/00
[52] U.S. Cl. ................................. 430/323; 430/270; 430/275; 430/313; 430/317; 430/318; 430/321; 430/325; 430/327; 156/643; 156/659.1
[58] Field of Search .................... 96/36.2, 38.2, 38.3, 96/38.4, 36; 430/313, 317, 318, 321, 323, 325, 327, 270, 275; 156/643, 659, 673

[56] References Cited

U.S. PATENT DOCUMENTS

| | | | |
|---|---|---|---|
| 3,561,963 | 2/1971 | Kiba | 439/5 |
| 3,620,795 | 11/1971 | Kiba | 430/12 |
| 3,707,372 | 12/1972 | Hallman et al. | 430/296 |
| 3,754,913 | 8/1973 | Takeuchi et al. | 430/5 |
| 3,892,571 | 7/1975 | Simeonov et al. | 430/5 |
| 4,052,211 | 10/1977 | Inoue et al. | 430/325 |
| 4,113,486 | 9/1978 | Sato | 430/321 |
| 4,115,127 | 9/1978 | Ikeda et al. | 430/270 X |
| 4,127,414 | 11/1978 | Yoshikawa et al. | 430/270 |
| 4,144,066 | 3/1979 | Ernsberger | 430/321 |

*Primary Examiner*—Edward C. Kimlin
*Attorney, Agent, or Firm*—George S. Indig

[57] ABSTRACT

Lithographic patterning of particular interest in fabrication of integrated circuitry is based on the photoinduced migration of silver into germanium selenide or other glassy material of appropriate absorption cross section for the chosen actinic radiation. Resists which are negative-acting yield high resolution attributed to initial introduction of the silver in chemically combined form chosen so as to result in formation of a silver compound with a glass component with the compound serving as silver source. Removal of excess silver-containing material is engineered on the basis of the form of silver introduction and results in conversion to a water soluble form. Commercial use will likely be based on an embodiment in which the now developed patterned resist serves as a dry etching mask during delineation of a relatively thick underlying layer of organic material. This procedure is particularly advantageous for use on partially processed circuitry in which prior operations have resulted in surface steps.

26 Claims, No Drawings

PHOTOINDUCED MIGRATION OF SILVER INTO CHALCOGENIDE LAYER

BACKGROUND OF THE INVENTION

A. Technical Field

Integrated circuitry, e.g., semiconductor, magnetic, or optic, as well as discrete devices of small size, are fabricated by use of a variety of lithographic procedures. Such procedures may be based on self-supporting masks which are, themselves, defined lithographically, and which are subsequently used for secondary pattern delineation. An alternative involves maskless processing or "direct writing" in which delineation is on a supported layer on the device or circuit undergoing fabrication.

Often the lithographic processing, intimately concerned with the actinic material (the resist), itself, is the limiting step with respect to the most important criterion of size or density.

B. History

Integrated circuit fabrication has reached a sophisticated stage in silicon technology. Available commercial product includes silicon chips, perhaps a quarter of an inch in major dimension, with such chip containing circuit elements necessary for 64,000 information bits. Fabrication of such circuitry requires reliable resolution of features as small as 4 micrometers and less.

Usual fabrication technology depends upon pattern delineation to result in a "master mask" which is then used for replication on light-sensitive material on the article being fabricated. Master masks may be produced by use of a programmed electron beam operating in a raster or vector scan mode on a 1:1 basis, or the mask may consist of a reticule, ordinarily larger than the final replicated pattern—commonly 10 X. Electron beam sensitive material used for primary pattern delineation generally takes the form of a polymeric material of either negative-acting or positive-acting characteristics. Negative acting material in which exposed regions are preferentially retained results from e-beam insolubilization—usually cross-linking. Positive acting material in which exposed regions are preferentially removed, results from e-beam solubilization—usually by polymer breakdown, perhaps to monomeric proportions.

Device fabrication involves pattern delineation either primary or replica—on a device-supported layer of actinic material (resist material). Following development in which exposed material is preferentially retained or removed, a fabrication step restricted to operation on now revealed underlying material is carried out. In the prevalent mask technique, replica patterning is based on near-UV. Resist material is commonly, again, organic and polymeric. In general, present needs are adequately met by use of commercially available photoresists.

It is fair to conclude that mask fabrication is not now resolution limited by primary delineation. Presently used electron beam patterning equipment and processes are conservatively suitable for resolution of feature size as small as 1 micron. While such delineation equipment itself is capable of far better resolution, commercial resist technology is limiting. Commercial resist technology is again limiting in actual device fabrication whether by replication delineation or direct writing. A concern in primary mask patterning is carried over—i.e., resolution dependence on contrast where wavelength-dependent interference becomes a problem. A new problem arises from the non-planar surface presented by circuitry during intermediate fabrication. From the physical standpoint, step coverage by the resist is complicated; from the lithographic standpoint, standing waves as well as depth of focus are significant.

A variety of resist approaches have been directed to improved resolution. U.S. Pat. No. 4,127,414 depends on photoinduced silver migration into a chalcogenide layer to reduce solubility in alkaline developer. Before exposure, the actinic material takes the form of a germanium-selenium glass layer supporting a thin silver layer. Processing involves stripping of the silver layer by aqueous aqua regia prior to development. While submicron delineation capability is reported, attempts to reproduce such results have been unavailing. Other advantages of such an inorganic system have been verified. Absorpton cross-section for most lithographic electromagnetic radiation is high, resulting in total absorption in usual resist layer thickness. Total absorption results in avoidance of depth dependance of exposure, i.e., of standing waves.

Another approach reported in 58 *Bell System Technical Journal* p. 1027 (1979) relies on a multilayer—usually a three-layer composite. As usually applied, the uppermost layer is an appropriately chosen resist which, upon exposure and development, serves as a mask during replication of the pattern in the second layer which latter, in turn, serves as a dry processing mask for a relatively thick underlying layer of an organic material. The function of the thick layer is to afford step coverage while presenting a smooth surface to the defining radiation. Standing waves during delineation do not cause a problem since they are restricted to the actinic material which is of uniform thickness and bounded by a smooth surface on one side and by a smooth interface on the other.

C. Summary of the Invention

1. Problem: Lithographic delineation, particularly in the fabrication of large-scale integrated circuits, is limited by a number of characteristics associated with the radiation-sensitive material and attendant processing. Interference, backscattering, and proximity effects tend to limit resolution particularly in low contrast material. Standing waves and other problems associated with non-planar surfaces of circuitry undergoing fabrication are a further limitation or resolution.

Standing wave and associated problems are lessened by a multilayer approach described in 58 *Bell System Technical Journal* p. 1027 (1979) which, in usual practice, makes use of a three-layer structure; a true radiation-sensitive resist at the free surface; an underlying blocking layer; and a relatively thick underlying layer which accommodates steps on the article surface and itself presents a smooth, planar surface. While the procedure may be a complete solution to the step problem, resolution limits of the resist remain unaffected.

Photoinduced migration of silver into a Ge/Se glass layer to insolubilize irradiated regions and thereby result in a negative acting resist as described in U.S. Pat. No. 4,127,414 is promising. Unfortunately, it has not been found possible to reliably reproduce the submicron features by use of the procedure reported. This procedure involves a "silver" layer atop the glass layer and relies upon stripping of excess silver subsequent to exposure by use of aqua regia. To a certain extent this approach inherently lessens the standing wave problem due to the high absorption cross-section of the glass.

2. Solution: A resist system based on photoinduced migration of silver into any of a family of glassy materials including GE/Se permits regular attainment of submicron resolution while lessening usual limitations on lithographic resolution such as those due to standing waves, interference, edge diffraction, and proximity effect. In a preferred embodiment, the patterned resist itself acts as a dry processing mask to permit replication in an underlying, relatively thick layer which accommodates substrate surface roughness so that a smooth surface is presented to the patterning energy.

Processes of the invention depend upon introduction of silver in a deposited layer atop a glassy layer as in the prior art. Silver is, however, deliberately introduced not as elemental material but in combined or complexed form so chosen as to result in interaction with one or more components of the glassy layer to yield a silver compound. In all processes herein, stripping of excess silver-containing material takes the form of reactants so designed as to convert any excess silver present into a silver halide where necessary, with subsequent or simultaneous reaction designed to result in further conversion of the halide into a water soluble, silver-containing material which is reliably removed in the aqueous stripping solution. Development is assured by providing such additional dissolution components as are required to remove any elemental or other ingredients outside the nominal composition.

DETAILED DESCRIPTION

I. General

Salient features of the generic invention relate to the form in which silver is introduced prior to exposure, and to the related manner in which unneeded silver is stripped prior to development. Simply stated, silver introduction is non-elemental—either compound or complex—designed to react with one or more glassy components to produce a compound which then serves as migration source. Photoinduced migration is quite consistent with the postulated mechanism which involves hole-electron pair generation by absorbed photons with holes combining with silver so that migration is truly migration of silver cations. Recombination effects, in accordance with the postulated mechanism, serve to explain the relatively shallow migration observed.

While a number of compositions may be utilized, silver has conveniently been added by dipping in an aqueous solution of an alkali metal silver cyanide. This compound may serve as a prototype of that family in which silver is introduced in anionic form. Rather than introduce elemental silver precautions are sometimes taken to avoid elemental silver. This may be accomplished for the example noted by use of a basic solution such as a solution containing excess cyanide. Any free silver introduced or resulting may otherwise form precipitate of lithographic consequence.

The stripping step is deliberately designed to remove unused "source silver"—i.e., the silver-glass reaction product which results prior to exposure. Aqua regia, a traditional solvent for noble metals such as silver, is not a suitable solvent for "source silver", in the usual instance, and where dissolution is effected only converts such "source silver" to silver chloride which precipitates on dilution during rinsing. Where used, such procedure constitutes the first of a two-step process. The second procedure results in conversion of the silver chloride to water soluble form. An exemplary second procedure depends upon use of aqueous KCN to result in $KAg(CN)_2$. Such a two-step procedural example represents the generic process in which the halide is converted to a water soluble form. In the usual case in which the source silver is non-halide, the first reaction, which need not be carried out in a separate procedure, results in formation of the halide. A single procedure stripping is described in the Examples. Reagents are chosen such as to result in a silver halide intermediate product. The invention does not depend on isolation of such intermediate product, but only upon choice of reagents which may result in such intermediate. (Differently stated, reagent/s are chosen such that reaction in isolation results in silver halide—e.g., the $I_2$ of the $KI+I_2$ solution of single procedure stripping may react with an Ag compound such as $Ag_2Se$ in isolation to produce AgI.)

Of lesser significance from the standpoint of the invention, but of importance to the processing engineer, is the inclusion in the developing solution of all ingredients necessary to assure dissolution. So, for example, in the germanium selenium glass system, in which sensitivity is increased for selenium content in excess of that indicated by the nominal stoichiometry $GeSe_2$ a sulphide or borohydride is desirably included to dissolve excess elemental selenium.

It is expected that use of the invention will, for the time being, largely concern replication delineation—either for device fabrication or for making copy masks. In general, a detailed discussion of fabrication reagents, environments, and processing conditions is considered outside the scope of this description. Such information is readily available. Procedures, as applied to fabrication of silicon circuits, are catalogued in copending application, Ser. No. 929,549 filed July 30, 1978. An advantage of the inorganic resist approach of this invention is durability in a variety of processing environments. Increased protection is afforded by use of the bilayer approach which constitutes a preferred embodiment.

Direct patterning, either of masks or in direct processing, may also require choice of materials and conditions outside the necessary scope of this description. In mask making, the inorganic resist, itself, may have sufficient mechanical durability. Where it is considered necessary to replicate underlying chrome or other material in accordance with conventional practice, this step is carried out on material and in accordance with processing both of which are well known. Considerations in subsequent direct processing are generally identical to those which concern device fabrication following replication delineation.

II. Parameter Ranges: As discussed, the invention is generically described in terms of (A) photoinduced migration of silver with the effective source represented as chemically combined as distinguished from elemental silver. In the usual case, chemical combination is that of a simple compound with one or more of the constituents of the glass (B) the nature of the stripping solution which removes excess silver prior to development. The stripping solution is designed to dissolve excess "source silver" which is in combined rather than elemental form. In certain preferred embodiments, the developer, too, is designed to accommodate the specific nature of (unexposed) material to be removed—e.g., in certain Ge/Se glasses in which Se is present in amount greater than that indicated by the nominal stoichiometry, $GeSe_2$, a developing component operating as a specific solvent for such excess Se is included.

As also indicated, commercial use is likely to take the form of the bilevel embodiment in which the silver-defined retained resist serves as a dry processing mask for underlying plastic material—e.g., novolac. In common with a prior approach described in 58 BSTJ 1027 (1979), a purpose served by such underlying plastic material is to present a smooth surface independent of wafer surface roughness. Glassy material serving as primary resist can then take the form of a smooth, planar layer of uniform thickness considered desirable for lithographic definition.

Paragraph designations in this system are the same as those used under "Examples".

(a) The Glass: Glass compositions suitable for the invention must meet certain fundamental requirements: (1) they must, of course, be amenable to deposition in requisite quality—physical and chemical uniformity, adhesion, etc.; (2) composition must be such as to accommodate migration of silver species as photoinduced; (3) glass must be soluble in an appropriate solvent which discriminates to the necessary extent as between silver modified (exposed) regions and unmodified (unexposed) regions; (4) glass must present a sufficient absorption cross-section to the selected actinic radiation to result in requisite sensitivity.

Examples herein are conveniently in terms of Ge/Se glass. Such glasses are representative of chalcogenide glasses, in general. Compositions may be binary, ternary, or more complex. Even such description is not limiting—conditions may arise where it is desirable to use an elemental glass; perhaps one which is thermodynamically unstable. Elemental glasses of this nature may be produced by a variety of techniques which have in common an extremely rapid cooling rate from a molten or some more energetic state.

Stable glass appropriate for practice of the invention generally contain selenium, tellurium, or sulphur. Glasses containing such elements are well known and include compositions based on admixture with germanium, arsenic, iodine, bismuth, etc. In general, choice of glass compositions is with regard to absorption cross-section for the particular radiation chosen rather than for accommodation of silver migration or other requisites noted. Suitability for a particular source requires only a transmission measurement. For the xenon mercury source used in many of the examples in the succeeding section, increased sensitivity results for nonstoichiometric Ge/Se compositions with excess relative Se to excess $GeSe_2$. For this particular glass system and this particular light source, the ~0.25 micron films are totally absorbing for the stoichiometric, as well as the nonstoichiometric, compositions. Experiments with thinner layers however show an increase for selenium-rich compositions so that it is concluded that absorption in the 0.25 micron layers is more concentrated near the incident surface for the nonstoichiometric compositions.

In general, layer thickness considerations are the same as for other resists. For the wet development contemplated, layer thickness is desirably not substantially greater than minimum feature size to be defined. Since glassy materials contemplated may easily be deposited to produce continuous layers in thicknesses of 2,000 Angstrom units and below, this desire is easily satisfied. Continuous layers of 1,000 Angstrom units and below have been produced by evaporation, as well as rf sputtering so that future lithographic needs may also be met. Thicker layers are ordinarily not contemplated but may be useful where larger features are used and where processing is under such corrosive conditions that increased masking time is useful.

(b) It has been indicated that a significant aspect of the invention concerns the manner in which silver is introduced. Every inventive embodiment contemplates reaction of silver with one or more glass components usually resulting in a simple chemical compound which serves as "source silver" during exposure. It has been found that such reaction proceeds most effectively by introduction of a silver compound rather than elemental silver. For comparative purposes examples in the succeeding section all depend on introduction of silver as aqueous $KAg(CN)_2$. Other experiments depend on use of a variety of compounds eg., $AgCH_3COO$, $Ag(NH_3)_2NO_3$. $AgNO_3$ etc. While not vital to the practice of the invention, it is interesting to note that silver is thereby made available in anionic form—$(Ag(CN)_2)^-$. Other complexes or compounds may be used. Particularly where feature size is small, it has been found desirable to avoid free elemental silver, in the instance of the specific complex noted, by use of excess CN. The effect of free silver is to result in precipitate which, unless completely removed, results in defects in the final pattern. It must be stressed that expedient reaction with one or more glass components to result in a useful migration source is accomplished only where silver incorporation is by means of introduction of ionized rather than neutral silver. The ionized form may be the simple cation $(Ag^+)$ or a complex.

The procedure for silver introduction is not critical. Silver is generally in the form of an aqueous solution, reasonably dilute—i.e., no more than about 0.3 molar (in terms of elemental silver). Use of increased concentration to values approaching saturation may be useful but have been observed to result in somewhat decreased sensitivity.

The above observations are based on dipping with residence time in the solution of the order of from one second to a few minutes. Higher concentrations necessitate shorter residence time for usual conditions (to maintain a silver level of reasonable transparency). More dilute solutions are suitable—in fact, were used in examples in the following section. Residence time in every instance is optimized in terms of sensitivity so that in an example presented, ninety seconds residence was found desirable for a 0.06 M solution.

(c) Radiation: Prescription of radiation is simply in terms of absorption cross-section. Certain of the appended examples illustrate sensitivity dependence on wavelength and, in the instance of e-beam, on accelerating voltage. Generally, chalcogenide glasses have sufficient cross-section to be useful over the entire range of actinic radiation ordinarily used in lithography—e.g., electromagnetic radiation up to about 4300 Angstrom units. At the short wavelength end, absorption cross-section for all contemplated glasses is satisfactory for at least near UV. Choice of compositions with this parameter in mind permits use of wavelengths appreciably below 3,000 Angstrom units. X-ray absorption is generally not sufficient in simple chalcogenide glasses which do not contain high atomic weight elements. Inclusion of tellurium or halides increases cross-section for this form of radiation. While glass layers are generally totally absorbing in contemplated thicknesses for electromagnetic radiation, at least above about 3,000 Angstrom units, this may not be true for accelerated electrons. It has been found that total absorption for an accelerating voltage of 10,000 volts results only in a layer thickness of about 5,000 Angstrom units (with greater thickness required for higher accelerating voltages). In general, the fact that electron absorption is not concentrated in the vicinity of the silver source results in a sensitivity considerably lower than for the best available organic electron beam resists available at this time. Nevertheless, other factors, such as, excellent resolution, good physical and chemical stability, as well as expected commercial availability of "brighter" source may suggest use of the inventive materials and processes for electron delineation, either primarily (e-beam) or secondary (ELIPS).

(d) & (e) This very critical procedure, which may be a single step, may be two-step, or in the latter case, may be repeated any number of times, is designed to accommodate silver reaction product ("source silver") formed by reaction with one or more glass components during or subsequent to application of combined silver. In contradistinction to previous processes which depended upon use of aqua regia to remove excess (unmigrated) silver, presumably elemental silver, present stripping is designed to remove the reaction product. In the instance of Ge/Se glass, the reaction product takes the form of silver selenide ($Ag_2Se$). Conversion of reaction product to the aqueous form considered necessary for uncritical complete uniform removal is, in every instance, brought about by reaction or series of reactions in which a silver halide at least as intermediate product is functional. Exemplary stripping procedures are set forth in the Examples. Typical two-step procedures involve a first step designed to produce the silver halide (in the instance of aqua regia the product of this first step is AgCl). Other work is based on combination, for example, with elemental halogens, $Cl_2$, $Br_2$, $I_2$, to result in corresponding silver halides. The second member of such two-step stripping accomplishes conversion of the halide to a water soluble form. So, for example, reaction with KCN results in $KAg(CN)_2$. A myriad of alternatives are known to the chemist, who may, for example, react AgI with a concentrated halide e.g., an alkali metal halide or more generally a metal halide—e.g., KI to result in soluble $K_5AgI_6$.

Single step stripping processes are equivalent and simply combine reagents to result in halide, as well as water soluble form of silver. An example is based on introduction of both potassium iodide and elemental iodine which, in combination with $Ag_2Se$, results in intermediate AgI which thereafter combines with KI to produce the potassium silver halide noted above. While in principle adequate stripping may be contemplated as proceeding out of non-aqueous media, experiments to date have failed to result in identification of a useful non-aqueous medium. In certain instances, organic material may be added to insure dissolution of a reagent. An example is inclusion of ethanol to assure dissolution of elemental iodine.

(f) Development, while certainly critical, does not deviate in philosophical approach from conventional practice. Developer may be made up in empirical fashion by appropriate combination of good and poor solvents to result in the desired discrimination or may be based on a single material which has appropriate properties. In certain instances, in recognition of specific glasses, it is desirable to include solvents specific to glass components. So, in members of the Ge/Se glass system in which Se content is above that dictated by the stoichiometric material, $GeSe_2$, and where usual solvent otherwise lithographically satisfactory may not result in complete removal of excess selenium, it is found useful to include a specific solvent—e.g., borohydride or a sulfide, such as $Na_2S$.

Examples were generally conducted with development carried out at ambient temperature (room temperature). In common with other lithographic processes, it may sometimes be desirable to increase or decrease temperature to optimize discrimination or throughput.

(g) A preferred embodiment is particularly applicable to ultimate processing of nonplanar substrate surfaces as are presented in a variety of processing steps in the fabrication of integrated circuitry. In this embodiment, the functional glassy layer is applied to a relatively thick underlying material with the latter serving to present a smooth, lithographically desirable, surface. With this objective, such underlying layer must be of sufficient thickness to accommodate deviations from a simple plane (in usual LSI processing, steps of the order of $\sim 0.5$ micron result and may be accommodated by a layer thickness of $\sim 2$ microns). Underlying material serves as a "sacrificial" layer in the manner of the BSTJ article, supra. Such sacrificial layers are ordinarily made of organic material, such as novolac, or any of a variety of thermoplastic or thermoset hydrocarbons which easily yield to processing—usually dry processing—to result in faithful replication of straight walled etch patterns. The resists of the invention are particularly appropriate for this purpose, since they adequately mask sacrificial layers from a variety of reagents, for example, oxygen plasma. Use of such resists, therefore, represents an advantage over more general prior art multilevel patterning which often requires a layer intermediate the resist and sacrificial layer to serve as the actual mask for the final lithographic etchant. Use of such intermediate layer is however not precluded and in certain circumstances may be usefully incorporated.

The requirement of vertical walls in relatively thick material may be met by dry etch processes in which pressure is sufficiently low and potential is sufficiently high to result in significant particle momentum; or, alternatively, may rely upon nonmomentum processes in which the chemistry is designed so that undercutting may be controlled. See U.S. patent application, Ser. No. 929,549 filed July 31, 1978.

A procedural variant depends upon edge control, as resulting directly from high contrast photoresist sacrificial layers. Experimental work has depended upon use of thick polymethyl methacrylate, as well as conventional inhibited novolac. Following this procedure, the developed glass resist pattern may serve as the UV, or preferably the deep UV, mask for the underlying actinic material which latter is thereafter developed in conventional matter. See, for example, 174, SPIE Proceedings, Paper 17 (1979).

D. EXAMPLES

Example 1

A silicon wafer bearing a thermally oxidized layer of silicon oxide is:

(a) coated with a 2,000 Angstrom units thick layer of 33 percent Ge, remainder Se, by evaporation and (b) immersed for sixty seconds in an aqueous solution containing 0.23 M $KAg(CN)_2$, rinsed in deionized water, and air dried at room temperature to yield a coating of Ag$_2$Se of a thickness of from 100 to 200 Angstrom units.

(c) An interference pattern is produced by use of a helium cadmium laser (wavelength 3250 Angstrom units) by beam splitting and beating. The exposure time is about forty seconds equivalent to 700–800 mj/cm$^2$.

(d) The exposed wafer is immersed for thirty seconds in a 25 vol. percent aqueous solution of aqua regia. The appearance changes from smooth to granular corresponding with formation of crystalline AgCl. The wafer is next rinsed in deionized water following which (e) it is immersed in a 1 weight percent solution of aqueous KCN for five seconds resulting in removal of the AgCl layer.

After rinsing, steps (d) and (e) ae repeated as necessary (in this instance once) to result in removal of the granular layer.

(f) The wafer is immersed for about one minute in a developing solution consisting of 1 gram NaBH$_4$ in 50 cc of an aqueous solution of tetramethyl ammonium hydroxide (N(CH$_3$)$_4$OH) (solution prepared by dissolving 150 grams of the compound in 500 cc of water). The now-developed wafer is rinsed and air dried. The resulting pattern is a grating of a period of 1700 Angstrom units.

Example 2

Example 1 is repeated, except that the developing solution (Step f) is 25 vol. percent of dimethylamine in water. Results are essentially identical.

Example 3

A silicon wafer bearing a 2½ micrometer coating of a novolac resin is:

(a) coated with a 2,000 Angstrom units thick layer of 33 percent Ge, remainder Se by evaporation; and (b) is immersed for ninety seconds in a 0.06 molar aqueous solution of KAg(CN)$_2$, is rinsed in deionized water and air dried at room temperature to yield a coating of Ag$_2$Se of a thickness of from 100–200 Angstrom units;

(c) is pattern irradiated by illumination with xenon mercury lamp through an electron beam generated master mask of 0.5 micron minimum feature size by contact printing. The lamp is unfiltered so that irradiation is by the entire output bandwidth which ranges from 2,000–4,000 Angstrom units. Exposure time is about thirty seconds;

(d) and (e) stripping is carried out in a single step corresponding with the two-step procedure of Example 1. The exposed wafer is immersed for sixty seconds in aqueous solution containing 0.3 molar KI plus 0.02 molar I$_2$. Upon extraction, a relief image defined by steps of a thickness approximating that of the preexposure silver selenide reaction product layer is observed—resulting from removal of the relatively unaffected Ag$_2$Se in regions which are not irradiated;

(f) the wafer is rinsed and developed.

Completion of development which, in this instance, takes about forty-five seconds in developer (aqueous solution containing 0.21 M Na$_2$SiO$_3$9(H$_2$O), 0.2 M Na$_3$PO$_4$ and 0.3 M NaOH) is carried to visual completion. The resulting developed pattern is a faithful replication of the original with good edge acuity. The particular pattern includes lines, spaces, gaps, isolated features, all at a size of 0.5 micron.

(g) Reactive ion etching in oxygen at a pressure of 7.5 micrometers of mercury and a power of 50 watts for forty minutes (sample on the driven electrode; electrode spacing 2½") results in replication of the pattern in the novolac layer with essentially vertical etch walls. In general, the pattern quality in this layer is essentially unchanged from that originally produced in the germanium selenium layer.

Examples 4–7

The procedure of Example 3 is repeated except that the patterning irradiating energy (step c) is filtered with different narrow bandpass filters. Filter center frequencies as well as energy required to result in retention of 100 percent thickness of resist are tabulated:

Example 4: 3100 Angstrom units     900 mj/cm$^2$
Example 5: 3560 Angstrom units     1100 mj/cm$^2$
Example 6: 4070 Angstrom units     1500 mj/cm$^2$
Example 7: 4300 Angstrom units     3500 mj/cm$^2$ The final product in each of Examples 4–7 is identical to that of Example 3.

Example 8

The procedure of Example 3 is followed, however, using a substrate of aluminum coated silicon. Consistent with transmission measurements made on resist coated quartz, total absorption avoids any standing wave problem so that results are, in every way, identical to those of Example 3.

Example 9

The procedure of Example 3 is repeated, however, using a partially completed 16K RAM (random access memory, large scale silicon integrated circuit) processed to the polysilicon level so as to present steps in the polysilicon of a height as great as 1 micrometer. The novolac layer as prepared by spinning presents a free surface which is smooth (without replication of the steps on the underlying substrate). Results are similar to those of Example 3. This experiment is designed to demonstrate independence of feature size from deviations in smoothness of the substrate. It is of particular consequence in the fabrication of LSI's or other devices in which the nature of multiple step processing is such as to result in surface steps.

Example 10

The procedure of Example 8 is repeated, however, using projection, rather than contact, printing. The final image manifests minimal line and space features of 0.75 micrometers in one direction only and 1.0 micrometers in the orthogonal direction. As in the previous examples, line control is independent of feature size so that equal lines and spaces are faithfully replicated from the smallest dimensions resolved to the largest contained feature size of 4 micrometers.

Example 11

The procedure of Example 3 is followed, with the exception that stripping (Steps (d)–(e)) is carried out by use of saturated bromine solution followed by aqueous KCN. (The KCN treatment of Step (e) is identical to that of Example 1.)

Example 12

The procedure of Example 3 is repeated, however, with (a) a 2,000 Angstrom units thick layer of 10 percent Ge, remainder Se, and Steps (d)–(e) using a two-step stripping such as used in Example 1 followed by development in an aqueous solution as in Example 3 with added 0.025 M Na$_2$S9H$_2$O. (g) The pattern was replicated in the underlying novolac layer by reactive ion etching in oxygen as in Example 3.

Example 13

Procedure of Example 12 is followed, the only variation being in the stripping procedure which is, again, two-step with step (d) consisting of dipping in 0.01 molar I$_2$ in ethanol, followed by rinsing and step (e) consisting of dipping in 3.0 molar KI. Results are as in Examples 3 and 12.

Examples 14–17

These examples are presented to illustrate sensitivity dependence of a low germanium-containing Ge/Se glass on radiation wavelength. The general form followed is the same as that followed in the similar series of Examples 4 through 7. The general procedure of Example 3 is followed with a 10 at. percent Ge, 90 at. percent Se glass.

Example 14: 3100 Angstrom Units    700 mj/cm$^2$
Example 15: 3560 Angstrom Units    750 mj/cm$^2$
Example 16: 4070 Angstrom Units    800 mj/cm$^2$
Example 17: 4300 Angstrom Units    1100 mj/cm$^2$ Results in each of Examples 14–17 are comparable with those of Example 3, again, with minimum feature size realized of the order of 0.5 micron.

Examples 18–20

This set of Examples is concerned with primary pattern delineation by use of a programmed electron beam. Examples within the set differ from each other in that the accelerating voltage is varied. All procedures followed other than exposure, are those of the preceding set, Examples 14–17. Pattern information—a simple pad of dimensions 1 mm×1 mm is introduced via a travelling Gaussian beam of 0.1 micrometer diameter. Results are tabulated:

|  | Accelerating Voltage | coulomb/cm$^2$ |
|---|---|---|
| Example 18: | 5,000 kv | 5 × 10$^{-5}$ |
| Example 19: | 10,000 kv | 2 × 10$^{-4}$ |
| Example 20: | 20,000 kv | 6 × 10$^{-4}$ |

In each instance, sensitivity is determined on basis of minimum exposure required for retention of resist layer thickness.

Examples 21–24

The procedure of Examples 14–17 is carried out with a glass composition of 15 at. percent Ge, 85 at. percent Se. The objective, again, is to determine the relationship of sensitivity and wavelength as determined by use of narrow bandpass optical filters with a xenon mercury lamp.

Example 21: 3100 Angstrom Units    300 mj/cm$^2$
Example 22: 3560 Angstrom Units    290 mj/cm$^2$
Example 23: 4070 Angstrom Units    300 mj/cm$^2$
Example 24: 4300 Angstrom Units    600 mj/cm$^2$ Patterning results are as described in the earlier examples.

Example 25

The procedure of Example 1 is followed, however, with the following changes: Step (a) The glassy layer is, again, of a thickness of 2,000 Angstrom units but of the composition 33 at. percent Ge, 67 at. percent S. Step (c) Exposure is by means of an unfiltered xenon mercury lamp for an exposure time of thirty seconds. (Pattern resolution under the test conditions is better than 1 micron.)

We claim:

1. Process for fabrication of an article comprising an operation during which the article undergoing fabrication comprises an article surface and an overlying actinic processing layer, said processing layer consisting essentially of a chalcogenide glass and silver-containing material, the silver-containing material being largely concentrated to essentially uniform depth in the vicinity of a surface of the said layer, including the steps of (1) selectively exposing portions of the said processing layer to actinic radiation so as to induce migration of silver in a direction from the said surface into the body of said layer within such exposed portions thereby defining a pattern of material of reduced solubility in a developing agent; (2) stripping so as to remove silver-containing material unaffected by radiation; (3) treating the said processing layer with said developing agent to selectively remove material within unexposed portions to produce a now patterned processing layer, characterized in that silver-containing material consists essentially of at least one chemical compound consisting of the reaction product of combined silver and at least one component of the glassy material, and in that stripping comprises reaction resulting in a water-soluble silver compound which reaction may be regarded as comprising conversion of silver halide to said water-soluble silver compound.

2. Process of claim 1 in which there is a sacrificial layer intermediate the said actinic processing layer and the said article surface.

3. Process of claim 2 in which the said sacrificial layer is processed so as to result in a replica pattern by exposing the article product resulting from processing in accordance with claim 1 to an agent which selectively attacks portions of the said sacrificial layer bared during patterning of the processing layer.

4. Process of claim 2 in which the said sacrificial layer is a polymeric material.

5. Process of claims 3 or 4 in which the said agent is a plasma-produced species resulting from discharge within an oxygen ambient.

6. Process of claim 5 in which the replica pattern in the said sacrificial layer is produced by reactive ion etching.

7. Process of claims 1, 3, or 4 in which the said article surface is patterned selectively within regions bared by the patterned processing layer by reaction with a fabrication agent, thereby resulting in a device-significant local alteration of the said article surface.

8. Process of claim 1 in which the said chalcogenide glass contains at least one chalcogen element selected from the group consisting of selenium, sulphur, and tellurium.

9. Process of claim 8 in which the amount of the said chalcogen element is in excess of the amount indicated by a stoichiometric compound formed with another constituent of the said glass and in which the said developing agent includes a solvent specific to the said chalcogen element.

10. Process of claim 9 in which the said excess chalcogen element is selenium.

11. Process of claim 10 in which the said specific solvent is selected from the group consisting of at least one compound sulfide and a borohydride.

12. Process of claim 1 in which the said silver-containing material is the reaction product of the said component of the glassy material together with a compound in which silver is included in anionic form as a part of a complex anion.

13. Process of claim 12 in which the said anion consists essentially of silver cyanide.

14. Process of claim 13 in which silver is introduced as $KAg(CN)_2$.

15. Process of claim 1 in which stripping comprises reaction which may be regarded as conversion of silver halide to a water soluble silver compound by reaction of the said halide with an alkali metal cyanide.

16. Process of claim 1 in which stripping comprises reaction which may be regarded as conversion of silver halide to a water soluble silver compound by reaction of the said halide with a halide.

17. Process of claim 1 in which the said silver halide consists essentially of silver chloride.

18. Process of claim 1 in which the said silver containing material is a non-halide and in which stripping comprises reaction which may be regarded as comprising conversion of the said silver-containing material to silver halide.

19. Process of claim 18 in which stripping comprises reaction carried out in two chemically distinct steps, the first resulting in silver halide, the second resulting in conversion of the said halide to a water soluble silver compound.

20. Process of claim 18 in which stripping comprises reaction in of a single step which may be regarded as producing silver halide as an intermediate product.

21. Process of claim 20 in which the stripping reaction involves reaction between the said silver-containing material and a solution of an alkali metal halide together with elemental halogen.

22. Process of claim 21 in which the alkali metal halide consists of potassium halide.

23. Process of claim 22 in which the alkali metal halide consists of potassium iodide and in which the said halogen consists of iodine.

24. Process of claim 1 in which selectively exposed portions correspond with transparent portions of a mask interposed between the said article and actinic radiation source.

25. Process of claim 24 in which the said article surface contains combined or uncombined silicon.

26. Process of claim 1 in which selective exposure results from modulation of a beam of said radiation which moves relative to the said article surface.

* * * * *